(12) United States Patent
Andreev et al.

(10) Patent No.: US 8,181,096 B2
(45) Date of Patent: May 15, 2012

(54) CONFIGURABLE REED-SOLOMON DECODER BASED ON MODIFIED FORNEY SYNDROMES

(75) Inventors: Alexander Andreev, San Jose, CA (US); Ilya V. Neznanov, Moscow (RU); Elyar E. Gasanov, Moscow (RU); Pavel A. Panteleev, Moscow (RU)

(73) Assignee: LSI Corporation, Milpitas, CA (US)

( * ) Notice: Subject to any disclaimer, the term of this patent is extended or adjusted under 35 U.S.C. 154(b) by 1183 days.

(21) Appl. No.: 11/957,621

(22) Filed: Dec. 17, 2007

(65) Prior Publication Data

US 2009/0158118 A1 Jun. 18, 2009

(51) Int. Cl.
*H03M 13/03* (2006.01)
(52) U.S. Cl. ........................... 714/784; 714/793
(58) Field of Classification Search ............... 714/784, 714/793
See application file for complete search history.

(56) References Cited

U.S. PATENT DOCUMENTS 6,631,488 B1 * 10/2003 Stambaugh et al. .......... 714/746

OTHER PUBLICATIONS

Jyh-Horng Jeng; Trieu-Kien Truong; , "On decoding of both errors and erasures of a Reed-Solomon code using an inverse-free Berlekamp-Massey algorithm," Communications, IEEE Transactions on , vol. 47, No. 10, pp. 1488-1494, Oct. 1999.*

Truong, T.-K.; Jeng, J.-H.; Cheng, T.C.; , "A new decoding algorithm for correcting both erasures and errors of Reed-Solomon codes," Communications, IEEE Transactions on , vol. 51, No. 3, pp. 381-388, Mar. 2003.*

Forney, G.D., Jr.; , "Syndrome realizations of linear codes and systems," Information Theory Workshop, 2003. Proceedings. 2003 IEEE , vol., No., pp. 214-217, Mar. 31-Apr. 4, 2003.*

G.D. Forney, Jr., "On Decoding BCH Codes", IEEE Transactions on Information Theory, vol. IT-11, pp. 543-557, Oct. 1965, New York, NY.

Robert H. Morelos-Zaragoza, "The Art of Error Correcting Coding", paragraph 4.3.2, John Wiley & Sons, 2002, West Sussex, England.

* cited by examiner

*Primary Examiner* — Cynthia Britt
(74) *Attorney, Agent, or Firm* — Christopher P. Maiorana, PC

(57) ABSTRACT

A method of configurable decoding is disclosed. The method generally includes the steps of (A) receiving a variable value in a configuration signal, (B) calculating a plurality of first syndromes corresponding to a particular codeword of a plurality of codewords received in an input signal, the particular codeword having a plurality of information symbols and a plurality of parity symbols coded such that up to a fixed value of a plurality of errors in the particular codeword are correctable, the fixed value being greater than the variable value, (C) transforming the first syndromes into a plurality of second syndromes such that no greater than the variable value of the errors in the particular codeword are correctable and (D) generating an intermediate signal carrying the second syndromes.

20 Claims, 4 Drawing Sheets

Eq.(1) $S_i = W(\alpha^{i+1}) = \sum_{j=0}^{n-1} W_j \alpha^{(i+1)j}$, for $i = 0,\ldots,n-1$ Eq.(2) $\Psi(X) = \prod_{i=1}^{2T-2H}(X - B_i) = \sum_{i=0}^{2T-2H} \psi_i X^{2T-2H-i}$ Eq.(3) $S'_i = \sum_{r=0}^{2T-2H} \psi_r S_{i+(2T-2H)-r}$, for $i = 0,\ldots,2H-1$ Eq.(4) $\begin{cases} S_0 = E_1 A_1 + \cdots + E_H A_H + E_{H+1} B_1 + \cdots + E_{2T-H} B_{2T-2H} \\ S_1 = E_1(A_1)^2 + \cdots + E_H(A_H)^2 + E_{H+1}(B_1)^2 + \cdots + E_{2T-H}(B_{2T-2H})^2 \\ \vdots \\ S_i = E_1(A_1)^{i+1} + \cdots + E_H(A_H)^{i+1} + E_{H+1}(B_1)^{i+1} + \cdots + E_{2T-H}(B_{2T-2H})^{i+1} \\ \vdots \\ S_{2T-1} = E_1(A_1)^{2T} + \cdots + E_H(A_H)^{2T} + E_{H+1}(B_1)^{2T} + \cdots + E_{2T-H}(B_{2T-2H})^{2T} \end{cases}$ Eq.(5) $S_i \psi_{2T-2H} + S_{i+1} \psi_{2T-2H-1} + \cdots + S_{i+2T-2H} \psi_0$, for $i = 0,\ldots,2H-1$ Eq.(6) $\sum_{r=0}^{2T-2H} \psi_r S_{i+(2T-2H)-r} = (\sum_{j=1}^{H} E_j (\sum_{r=0}^{2T-2H} \psi_r (A_j)^{(i+1)+(2T-2H)-r})) + (\sum_{j=1}^{2T-2H} E_{H+j} (\sum_{r=0}^{2T-2H} \psi_r (B_j)^{(i+1)+(2T-2H)-r}))$, for $i = 0,\ldots,2H-1$ Eq.(7) $\sum_{r=0}^{2T-2H} \psi_r S_{i+(2H-2H)-r} = (\sum_{j=1}^{H} E_j \Psi(A_j)(A_j)^{i+1}) + (\sum_{j=1}^{2T-2H} E_{H+j} \Psi(B_j)(B_j)^{i+1})$, for $i = 0,\ldots,2H-1$ Eq.(8) $\sum_{r=0}^{2T-2H} \psi_r S_{i+(2T-2H)-r} = (\sum_{j=1}^{H} E_j \Psi(A_j)(A_j)^{i+1})$, for $i = 0,\ldots,2H-1$ Eq.(9) $S'_i = \sum_{r=0}^{2T-2H} \psi_r S_{i+(2T-2H)-r}$, for $i = 0,\ldots,2H-1$ Eq.(10) $E'_j = E_j \Psi(A_j)$, for $j = 1,\ldots,H$ Eq.(11) $\sum_{j=1}^{H} E'_j (A_j)^i = S'_i$, for $i = 0,\ldots,2H-1$

FIG. 5

CONFIGURABLE REED-SOLOMON DECODER BASED ON MODIFIED FORNEY SYNDROMES

FIELD OF THE INVENTION

The present invention relates to feed-forward decoders generally and, more particularly, to a method and/or apparatus for implementing a configurable Reed-Solomon decoder based on modified Forney syndromes.

BACKGROUND OF THE INVENTION

Reed-Solomon (RS) codes are a well-known and powerful class of error-correcting codes with various areas of application. Error correction is achieved by appending extra parity (or check) symbols to a block of information symbols (i.e., an information message), thus obtaining a codeword (i.e., an encoded message). When the codeword is transmitted through a channel, some symbols often become corrupted. However, the information from the parity symbols allows a decoder to reconstruct the original information message if the total number of errors induced by the channel is no more than a maximum error limit predetermined for the RS encoder and the RS decoder.

The maximum error limit is a construction parameter for the RS encoder and the RS decoder. Successful decoding is possible only if the number of errors added to the codeword by the channel is no more than the maximum error limit. Otherwise, the RS decoder can either decline to perform the correction or can provide incorrect results. If the maximum error limit has a value (i.e., T), the number of extra parity symbols that are appended to the information message is 2T. The appended parity symbols give a relation between a length of the information message (e.g., INFO_LEN) and a total length of the codeword (i.e., LEN) of LEN=INFO_LEN+2T.

Many conventional hardware implementations of RS encoders and RS decoders deal with fixed maximum error limit values. Therefore, the maximum error limit parameter is considered at instantiation time of the RS encoders and the RS decoders and cannot be changed at runtime. It is desirable for the maximum error limit of the RS encoders and the RS decoders to be variable at runtime.

SUMMARY OF THE INVENTION

The present invention concerns a method of configurable decoding. The method generally comprises the steps of (A) receiving a variable value in a configuration signal, (B) calculating a plurality of first syndromes corresponding to a particular codeword of a plurality of codewords received in an input signal, the particular codeword having a plurality of information symbols and a plurality of parity symbols coded such that up to a fixed value of a plurality of errors in the particular codeword are correctable, the fixed value being greater than the variable value, (C) transforming the first syndromes into a plurality of second syndromes such that no greater than the variable value of the errors in the particular codeword are correctable and (D) generating an intermediate signal carrying the second syndromes.

The objects, features and advantages of the present invention include providing a method and/or apparatus for implementing a configurable Reed-Solomon decoder based on modified Forney syndromes that may (i) implement a variable maximum error limit decoding, (ii) enable changes at runtime of the maximum number of errors that may be corrected, (iii) adapt to error rate changes over time, (iv) reduce parity data in a storage medium, (v) enable faster data transfers by transmitting reduced parity data and/or (vi) process conventional Reed-Solomon codewords.

BRIEF DESCRIPTION OF THE DRAWINGS

These and other objects, features and advantages of the present invention will be apparent from the following detailed description and the appended claims and drawings in which:

FIG. 5 is a set of equations.

DETAILED DESCRIPTION OF THE PREFERRED EMBODIMENTS

Operating with a runtime variable value for a maximum error limit to correct errors may be beneficial in cases where fewer errors than the maximum error limit are expected in a received codeword. A reduction in the maximum error limit generally reduces a number of parity symbols to be transmitted, stored and processed. Fewer syndromes may be used in correcting the fewer errors thereby saving on computational resources.

A variable maximum error limit may allow an encoder and/or a decoder to use a transmission channel and/or storage channel (or medium) in an efficient way. If the channel properties (e.g., Signal-to-Noise Ratio, SNR) change with time, the variable error limit may continuously accommodate the property changes. In some technology areas, for instance in storage devices, the expense of extra bits that do not carry customer information is high. If the storage channel SNR is better than expected, saving on a number of parity symbols being stored may bring significant revenue.

Reed-Solomon codes generally include a notion of erasure in the transmission/storage channel and a notion of decoding with both errors and erasures. An erasure may be an error in a symbol position that is known to the decoder before the codeword is processed. As such, the decoder knows a priori that a received codeword contains errors in the erasure positions. Therefore, the decoder may calculate only the error values in the erasure positions to restore the original data values. For other errors, the decoder generally calculate both the error positions and the error values to restore the original data values. Furthermore, G. D. Forney Jr. presented methods to extend a typical Reed-Solomon decoding to deal with errors and erasures rather than errors only. Among the methods are modified Forney Syndromes and a modified Forney algorithm for evaluating the error magnitudes in positions of errors and erasures. See (i) "On Decoding BCH Codes", by G. D. Forney Jr., IEEE Transactions on Information Theory, volume IT-11, pages 543-557, October 1965, New York, N.Y. and (ii) "The Art of Error Correcting Coding", by Robert H. Morelos-Zaragoza, paragraph 4.3.2, John Wiley & Sons, 2002, West Sussex, England, which are hereby incorporated by reference as cited.

Figure 1:
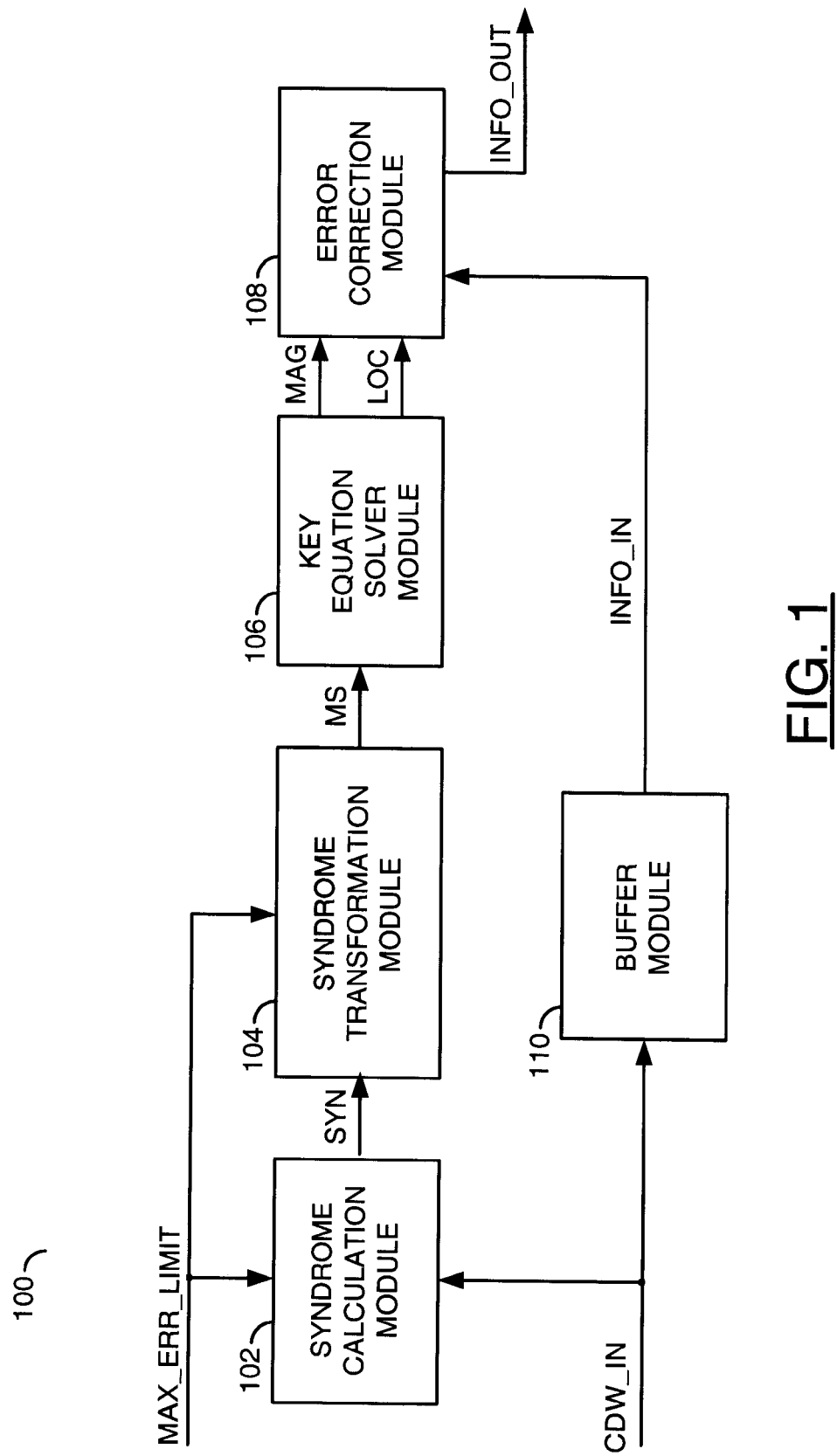
FIG. 1 is a block diagram of an example implementation of an apparatus in accordance with a preferred embodiment of the present invention.

Referring to FIG. 1, a block diagram of an example implementation of an apparatus 100 is shown in accordance with a preferred embodiment of the present invention. The apparatus 100 may implement a decoder having a configurable maximum error correction limit. In some embodiments, the decoding may implement a Reed-Solomon decoding using modified Forney syndromes. The modified Forney syndromes may be created by the Forney method from the syndromes of the codewords.

The apparatus 100 generally comprises a module (or circuit) 102, a module (or circuit) 104, a module (or circuit)) 106, a module (or circuit) 108 and a module (or circuit) 110. A signal (e.g., CDW_IN) may be received by the module 102 and the module 110. A signal (e.g., MAX_ERR_LIMIT) may be received by the module 102 and the module 104. The module 102 may generate and present a signal (e.g., SYN) to the module 104. The module 104 may generate and present a signal (e.g., MS) to the module 106. A signal (e.g., MAG) may be generated by the module 106 and presented to the module 108. The module 106 may also generate and present a signal (e.g., LOC) to the module 108. A signal (e.g., INFO_IN) may be presented from the module 110 to the module 108. A signal (e.g., INFO_OUT) may be generated and presented by the module 108.

Figure 2:
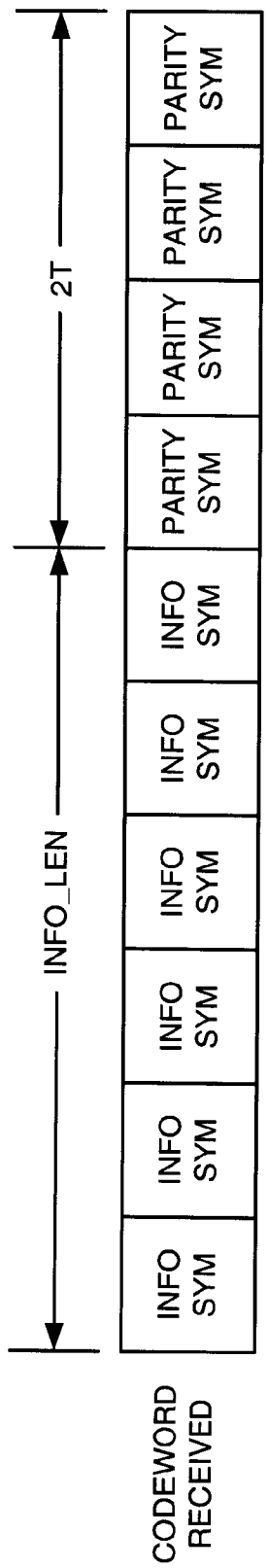
FIG. 2 is a block diagram of an example codeword as received.

The signal CDW_IN may carry a sequence of codewords encoded to enable error detection and correction. The error correction aspect of the encoding generally permits up to the maximum error limit (e.g., a fixed value "T") of errors to be corrected. Each of the received codewords may include multiple information symbols (INFO SYM) and multiple parity symbols (PARITY SYM), as illustrated in FIG. 2. A total number of information symbols may be referred to as an information length value (e.g., INFO_LEN). A total number of parity symbols may be twice the maximum error limit (e.g., 2T). As such, a total number of symbols in each of the codewords (e.g., CODEWORD_LEN) may be a sum of the information length value and the parity length value (e.g., CODEWORD_LEN=INFO_LEN+2T). In some embodiments, the codewords may be implemented as Reed-Solomon codewords. Other forward-error correction codec codewords may be implemented to meet the criteria of a particular application.

The signal MAX_ERR_LIMIT may carry a configuration value (e.g., a variable value "H"). The value H may program decoding operations of the apparatus 100 such that at most only H errors may be subject to error position detection and error value correction. The variable value H may range from zero to the fixed value T ($0 \leq H \leq T$).

The signal INFO_OUT may carry information values (or data messages) recovered from the codewords. Each of the information values generally comprises a multi-bit value (e.g., an 8-bit value). Other bit sizes of the information values may be implemented to meet the criteria of a particular application.

Figure 3:
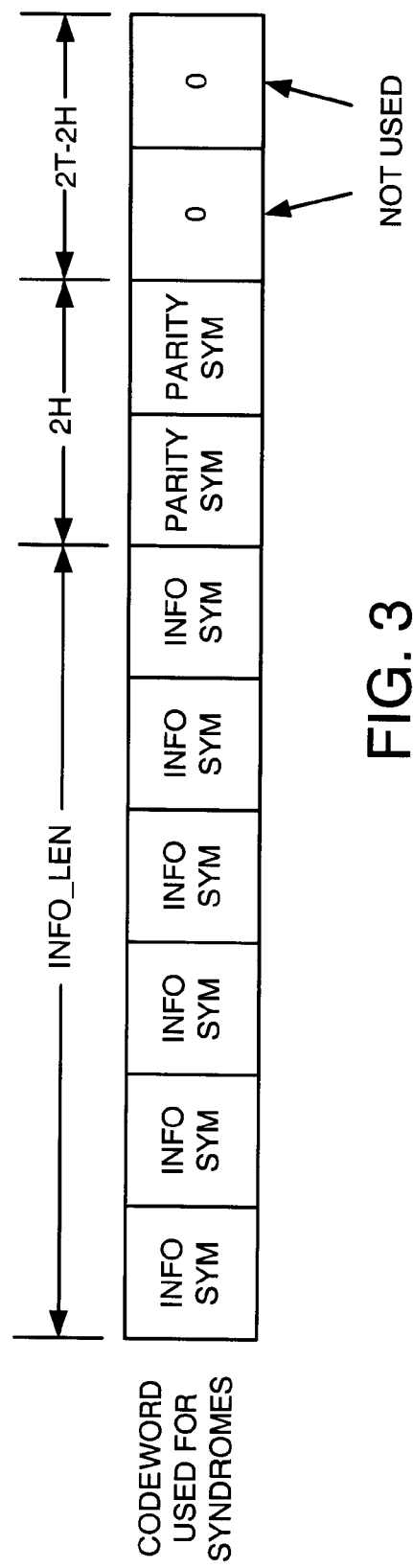
FIG. 3 is a block diagram of the example codeword as used to calculate syndromes.

The module 102 generally implements a syndrome calculation module. The module 102 may be operational to generate sets of 2T syndromes in the signal SYN based on the symbols received in the codewords. One set of syndromes may be calculated for each of the codewords. The number of parity symbols used by the module 102 from each codeword may be controlled by the variable value H received in the signal MAX_ERR_LIMIT. Generally, only 2H parity symbols may be accepted from each codeword. The remaining 2T-2H parity symbol locations may not read by the module 102 (e.g., treated as if filled with zeros), as shown in FIG. 3. The 2H parity symbols may be suitable to enable correction of up to H errors of unknown magnitude and unknown location.

The module 104 may implement a syndrome transformation module. The module 104 is generally operational to transform the set of 2T syndromes received from the module 102 to create a set of 2H modified Forney syndromes in the signal MS. The number of modified Forney syndromes created by the module 104 may be controlled by the variable value H received in the signal MAX_ERR_LIMIT. The transformation may be performed by formula Eq. 3 in FIG. 5. The transformation may be straight forward as the positions of erasures (and thus the coefficients Of $\psi_r$) may be known in advance.

The module 106 may implement a key equation solver module. The module 106 may be operational to calculate error evaluator polynomials in the signal MAG based on the modified syndromes. The module 106 may also be operational to calculate error location polynomials in the signal LOC based on the modified syndromes.

The module 108 generally implements an error correction module. The module 108 may be operational to correct errors in the information symbols received in the signal INFO_IN based on the error location polynomials and the error evaluator polynomials. The magnitudes of the errors may be calculated by the module 108 on-the-fly. The error corrected information symbols may be presented in the signal INFO_OUT as a sequence of decoded information values.

The module 110 may implement a buffer module. The module 110 may be operational to store only the information symbols of each codeword received in the signal CDW_IN. A capacity of the module 110 may be sufficient to store the information symbols of a single codeword to a few codewords. Other memory sizes may be implemented to meet the criteria of a particular application. Buffing of the information symbols generally allows time for the modules 102, 104 and 106 to process the codewords to create the signal LOC and the signal MAG. The module 110 may present the information symbols to the module 108 in the signal INFO_IN, symbol by symbol. Since the signal INFO_IN does not include the parity symbols from the signal CDW_IN, errors in the parity symbols may be left uncorrected and thus may be absent from the signal INFO_OUT.

Figure 4:
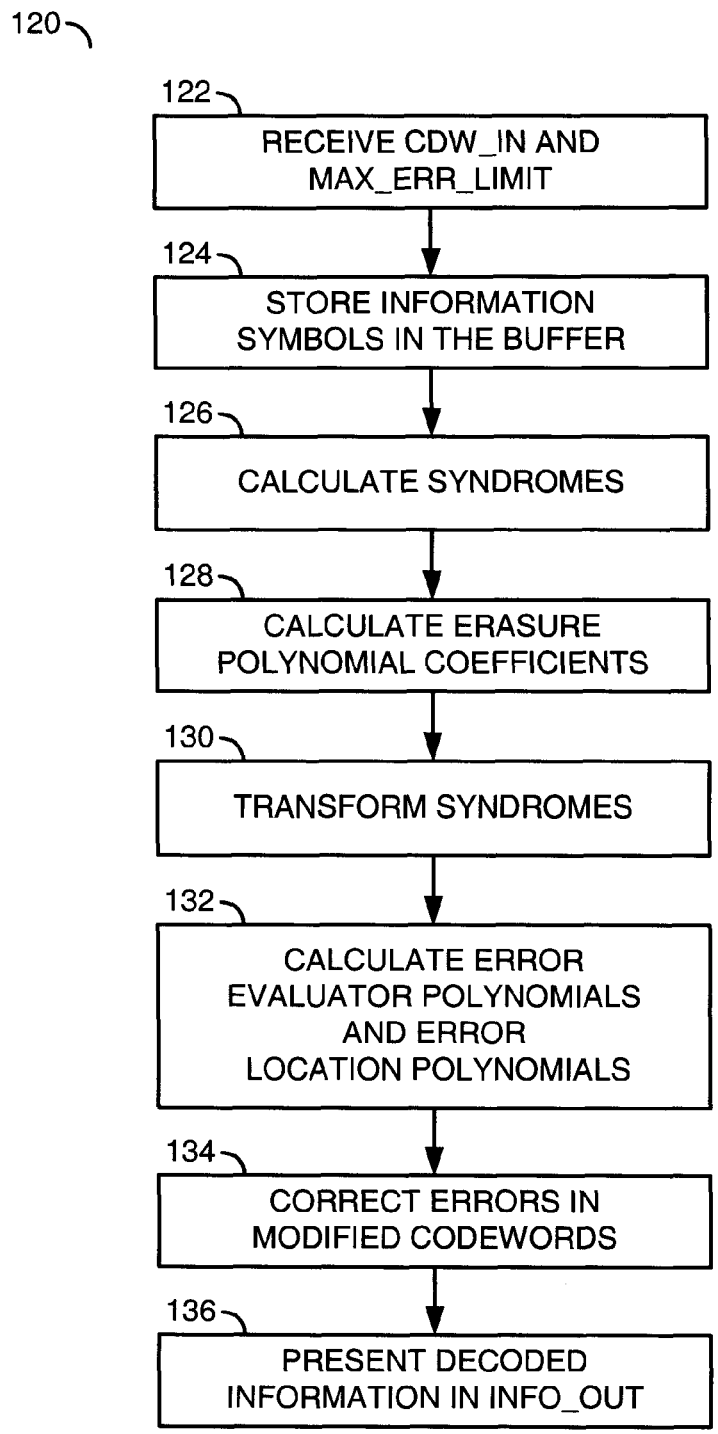
FIG. 4 is a flow diagram of an example decoding method.

Referring to FIG. 4, a flow diagram of an example decoding method 120 is shown. The method (or process) 120 may be performed by the apparatus 100. The method 120 may implement a configurable decoding with a variable maximum error limit (e.g., H) using modified Forney syndromes. The method 120 generally comprises a step (or block) 122, a step (or block) 124, a step (or block) 126, a step (or block) 128, a step (or block) 130, a step (or block) 132, a step (or block) 134 and a step (or block) 136.

The method 120 may begin with the reception of the encoded codewords by the modules 102 and 110 and reception of the variable configuration value H by the modules 104 and 106 in the step 122. The module 110 may buffer only the information symbols from the codewords in the step 124. In the step 126, the module 102 may generate the syndromes corresponding to the information symbols and the first 2H parity symbols received codewords.

Consider a Galios Field $GF(2^d)$ having $2^d$ elements. Let a variable $n=2^d-1$, where T may be the maximum error limit for decoding. A sequence W (e.g., $W=(W_0, W_1, \ldots, W_{n-1})$) is generally defined with elements from $GF(2^d)$ to be the codeword received in the signal CDW_IN. The sequence W may be considered a polynomial W(X) (e.g., $W(X)=W_0+W_1 X+ \ldots +W_{n-1}X^{n-1}$). An element $\alpha$ may be considered a primitive element of $GF(2^d)$. An element $\alpha^i$ for $i=i_0, \ldots, i_0+2T-1$ may be considered roots of a generator polynomial for the code. As such, if no errors are present in the codeword, $W(\alpha^i)=0$ for $i=i_0, \ldots, i_0+2T-1$. For simplification, $i_0$ may be defaulted to unity (e.g., $i_0=1$). A set of syndromes S (e.g., $S=\{S_0, \ldots, S_{2T-1}\}$) may be calculated by the module 102 per equation 1, as shown in FIG. 5. The syndromes may be passed from the module 102 to the module 104 in the signal SYN.

The module 104 may modify the syndromes S received from the module 102. The transformation generally reconfigures the number of errors that may be corrected by the apparatus 100 to no more than H errors, where $0 \leq H \leq T$. Consider a decoding that may involve errors and erasures, for example H errors and 2T-2H erasures. The 2T-2H positions of erasures (e.g., positions $B_1, \ldots, B_{2T-2H}$) may be known in advance since such erasure positions may not depend on the codeword. Therefore, a goal may be to find both the positions and the error values in the H errors. Furthermore, the error values for the erasure positions may be treated as don't care values.

In the step 128, the module 104 may calculate an erasure polynomial per equation 2, as shown in FIG. 5, where $\psi_0=1$. Since the erasure positions are known, all of the coefficients $\psi_i$ may be calculated directly in advance. The transformation generally maps a set of syndromes S to a set of modified Forney syndromes S' (e.g., $S'=\{S'_0, \ldots, S'_{2H-1}\}$). In the step 130, the module 104 may perform the transform per equation 3, as shown in FIG. 5. The signal MS may convey the modified syndromes to the module 106.

The module 106 may run a key equation solving procedure over the modified syndromes. The key equation solving procedure generally takes a sequence of modified syndromes S' and calculates both (i) an error locator polynomial (e.g., $\Lambda(X)$) of degree DEG_LOC in the step 132, where DEG_LOC<H and (ii) an error evaluator polynomial (e.g., $\Omega(X)$) of degree DEG_VAL in the step 132, where DEG_VAL<H. Calculations of the polynomials may be implemented in any one or more of several ways. For example, a Berlekamp-Massey method and/or a Euclidian method may be used to determine the polynomials. Other methods may be implemented to meet the criteria of a particular application. The error locator polynomial $\Lambda(X)$ may be transferred to the module 108 in the signal LOC. The error evaluator polynomial $\Omega(X)$ may be transferred to the module 108 in the signal MAG.

In the step 134, the module 106 may use both the error locator polynomial $\Lambda(X)$ and the error evaluator polynomial $\Omega(X)$ to correct actual errors in the codeword. Since the apparatus 100 receives the signal MAX_ERR_LIMIT carrying the limit value H, the limit value H may be changed at runtime. The correction generally restores any corrupted information symbols back into the original information symbols. The module 108 generally corrects, if appropriate, the information symbols buffered in the module 110 in the step 136 and then presents the information symbols in the signal INFO_OUT.

Operationally, the last 2T-2H symbols of each codeword in the signal CDW_IN may not be processed by the apparatus 100 as if the last 2T-2H symbols were not transmitted or stored. Thus, an effective length of the codewords may be INFO_LEN+2H. The 2H parity symbols are generally enough to recover from H errors.

A correctness of the method 120 may be given as follows. The value T may be the constructive maximum error limit for decoding where a practical decoding limit may be implemented to correct only H errors and 2T-2H erasures. Let $$C(X) = \sum_{i=0}^{n-1} C_i X^i$$

be the original codeword transmitted by an encoder and $$W(x) = \sum_{i=0}^{n-1} W_i X^i$$

be the corrupted codeword on an output end of a channel. Thus, $W(X)=C(X)+E(X)$, were $$E(X) = \sum_{i=0}^{n-1} E_i X^i$$

may be an error polynomial. Let $\{L_1, \ldots, L_k\}$ be a set of the positions of errors and $\{M_1, \ldots, M_{2T-2H}\}$ be a set of the erasure positions. Denote by $A_i=\alpha^{L_i}$, the locators of the errors, for $i=1, \ldots, H$. Denote by $B_i=\alpha^{M_i}$ the locators of erasures, for $i=1, \ldots, 2T-2H$. Denote by $E_i=e_{L_i}$ the error values at the error positions, for $i=1, \ldots, H$. Denote by $E_i=e_{M_{(i-H)}}$ the error values at the erasure positions, for $i=H+1, \ldots, 2T-H$. For each i, where $i=1, \ldots, 2T$ and $C(i)=0$, the key equation system may be defined by an equation set 4, as shown in FIG. 5.

The erasure polynomial may be defined by equation 2 with coefficients $\psi_r$, for $r=0, \ldots, 2T-2H$. The key equation system may be modified by replacing each of the equations Si, for $i=0, \ldots, 2T-1$ by a linear combination of equations, as shown in equation 5 of FIG. 5. Therefore, the key equation system may be defined by equation 6, as shown in FIG. 5. Equation 7 may be equation 6 rewritten in terms of the erasure polynomial $\Psi(X)$. Since $B_j$ may be the roots of $\Psi(x)$ (e.g., $\Psi(B_j)=0$), equation 7 may be simplified as equation 8. The syndrome $S'_i$ may be denoted per equation 9 and $E'_j$ may be denoted per equation 10. Therefore, the key equation system generally has a form of equation 11, as shown in FIG. 5.

The original key equation system of equation 4 may be reduced to the system of equation 11. From equation 11, (i) locators of the error positions $A_i$, for $i=1, \ldots, H$ and (ii) new error values for the error positions $E'_i$, for $i=1, \ldots, H$ may all be defined by applying the standard key equation solver procedure to the last system of equation 11. Since the error values $E_i$, for $i=H+1, \ldots, 2T-H$ may be ignored in the positions of erasures, sufficient data generally exist to recover from up to H errors.

The functions performed by the diagrams of FIG. 1-5 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. A method of configurable decoding, comprising the steps of:
   (A) receiving a variable value in a configuration signal;
   (B) calculating a plurality of first syndromes corresponding to a particular codeword of a plurality of codewords received in an input signal, said particular codeword having a plurality of information symbols and a plurality of parity symbols coded such that up to a fixed value of a plurality of errors in said particular codeword are correctable, said fixed value being greater than said variable value;
   (C) transforming said first syndromes into a plurality of second syndromes such that no greater than said variable value of said errors in said particular codeword are correctable; and
   (D) generating an intermediate signal carrying said second syndromes.

2. The method according to claim 1, further comprising the steps of:
   generating an error locator polynomial based on said second syndromes; and
   generating an error evaluator polynomial based on said second syndromes.

3. The method according to claim 2, further comprising the step of:
   generating an output signal carrying a plurality of decoded information values by correcting up to said variable value of said errors in said information symbols using both said error locator polynomial and said error evaluator polynomial.

4. The method according to claim 2, further comprising the step of:
   buffering said information symbols alone until said error locator polynomial is generated.

5. The method according to claim 1, wherein said calculating of said first syndromes operates on less than all of said parity symbols in said particular codeword as controlled by said variable value.

6. The method according to claim 1, wherein said calculating of said first syndromes creates twice said fixed value of said first syndromes.

7. The method according to claim 1, wherein said transforming of said first syndromes creates twice said variable value of said second syndromes.

8. The method according to claim 1, wherein errors in said parity symbols are left uncorrected.

9. The method according to claim 1, wherein said transforming of said first syndromes is based on a plurality of positions of erasures.

10. The method according to claim 1, wherein (i) said configurable decoding comprises a Reed-Solomon decoding and (ii) said second syndromes comprise a plurality of modified Forney syndromes.

11. An apparatus comprising:
    a syndrome calculator configured to (i) receive a variable value in a configuration signal and (ii) calculate a plurality of first syndromes corresponding to a particular codeword of a plurality of codewords received in an input signal, said particular codeword having a plurality of information symbols and a plurality of parity symbols coded such that up to a fixed value of a plurality of errors in said particular codeword are correctable, said fixed value being greater than said variable value; and
    a transformation module configured to (i) receive said variable value in said configuration signal, (ii) transform said first syndromes into a plurality of second syndromes such that no greater than said variable value of said errors in said particular codeword are correctable and (iii) generate an intermediate signal carrying said second syndromes.

12. The apparatus according to claim 11, further comprising a key equation solver module configured to (i) generate an error locator polynomial based on said second syndromes and (ii) generate an error evaluator polynomial based on said second syndromes.

13. The apparatus according to claim 12, further comprising an error correction module configured to generate an output signal carrying a plurality of decoded information values by correcting up to said variable value of said errors in said information symbols using both said error locator polynomial and said error evaluator polynomial.

14. The apparatus according to claim 12, further comprising a buffer configured to buffer said information symbols alone until said error locator polynomial is generated.

15. The apparatus according to claim 11, wherein said syndrome calculator operates on less than all of said parity symbols in said particular codeword as controlled by said variable value to calculate said first syndromes.

16. The apparatus according to claim 11, wherein said syndrome calculator creates twice said fixed value of said first syndromes.

17. The apparatus according to claim 11, wherein said transformation module creates twice said variable value of said second syndromes.

18. The apparatus according to claim 11, wherein errors in said parity symbols are left uncorrected.

19. The apparatus according to claim 11, wherein said transformation module transforms said first syndromes based on a plurality of positions of erasures.

20. An apparatus comprising:
    means for (i) receiving a variable value in a configuration signal and (ii) calculating a plurality of first syndromes corresponding to a particular codeword of a plurality of codewords received in an input signal, said particular codeword having a plurality of information symbols and a plurality of parity symbols coded such that up to a fixed value of a plurality of errors in said particular codeword are correctable, said fixed value being greater than said variable value; and
    means for (i) receiving said variable value in said configuration signal, (ii) transforming said first syndromes into a plurality of second syndromes such that no greater than said variable value of said errors in said particular codeword are correctable and (iii) generating an intermediate signal carrying said second syndromes.

* * * * *